United States Patent [19]

Deboo et al.

[11] 3,714,588

[45] Jan. 30, 1973

[54] SELF-TUNING BANDPASS FILTER

[75] Inventors: Gordon J. Deboo; Roger C. Hedlund, both of Sunnyvale, Calif.

[73] Assignee: The United States of America as represented by the Administrator of the National Aeronautics and Space Administration

[22] Filed: Oct. 13, 1970

[21] Appl. No.: 80,368

[52] U.S. Cl. ......................328/167, 330/86, 330/109

[51] Int. Cl. ..............................................H03b 1/04

[58] Field of Search ........328/133, 155, 167; 330/21, 330/31, 86, 35, 107, 109; 331/25–27; 323/101, 106; 307/232; 329/126; 333/17; 334/16

[56] References Cited

UNITED STATES PATENTS 3,436,647 4/1969 Gobeli et al. ....................328/155 X
3,021,481 2/1962 Kalmus et al. ...................328/133 X
2,976,408 3/1961 Colaguori ..........................333/17 X
3,293,572 12/1966 Smith ................................334/16 X
3,588,752 6/1971 Hirshfield ...........................333/17

OTHER PUBLICATIONS

Doyle, "FET and OP-AMP Audio Circuits" Radio-Electronics, July 1970, pp. 46–49
Hurel et al., "Active Band-Pass Filter", IBM Technical Disclosure Bulletin, October 1968 p. 491.

*Primary Examiner*—Roy Lake
*Assistant Examiner*—James B. Mullins
*Attorney*—Darrell G. Brekke and John R. Manning

[57] ABSTRACT

An electronic filter which simultaneously maintains a constant bandwidth and a constant center frequency gain as the input signal frequency varies, and remains self-tuning to that center frequency over a decade range. The filter utilizes a field effect transistor (FET) as a voltage variable resistance in the bandpass frequency determining circuit. The FET is responsive to a phase detector to achieve self-tuning.

5 Claims, 8 Drawing Figures

INVENTORS
GORDON J. DEBOO
ROGER C. HEDLUND
BY [signature]
ATTORNEY

INVENTORS
GORDON J. DEBOO
ROGER C. HEDLUND
BY
ATTORNEY

INVENTORS
GORDON J. DEBOO
ROGER C. HEDLUND
BY [signature]
ATTORNEY

SELF-TUNING BANDPASS FILTER

The invention described herein was made by employees of the United States Government and may be manufactured and used by or for the Government for governmental purposes without the payment of any royalties thereon or therefor.

BACKGROUND OF THE INVENTION

The present invention relates generally to electronic filters and more particularly to an improved self-tuning, bandpass filter providing narrow-band filtering with improved signal-to-noise ratio resolution.

Bandpass filters are widely used in electronic systems and instrumentation to improve the signal-to-noise ratio. When the frequency of the input signal is variable as, for example, where the input signal is obtained from any of several types of vibrating transducers, a wide-band filter is frequently used to avoid signal attenuation at both ends of the frequency spectrum. Such filters, however, are not as effective in rejecting noise as are narrow-band filters and their use is subject to other well-known disadvantages.

Since the frequency variation of an input signal is typically small relative to the full range of expected input signal frequencies, in many cases efficient filtering can be obtained by using a self-tuning filter of a constant narrow bandwidth which automatically adjusts its center frequency to track the signal frequency. Although conventional filters are known which have the capability of tracking the input signal frequency, they usually require a noise free reference signal at the same, or a multiple of the frequency of the signal to be filtered. An example is the "lock-in" amplifier type which can follow signals with small variations in frequency. Such systems are unduly complicated and generally unsuited for some applications.

OBJECTS

It is therefore an important object of the present invention to provide an improved self-tuning bandpass filter with a constant bandwidth.

Another object of the present invention is to provide an improved self-tuning bandpass filter with a constant center frequency gain.

Another object of the present invention is to provide an improved self-tuning bandpass filter covering a wide range of frequencies.

Still another object of the present invention is to provide an improved self-tuning bandpass filter which can be used at frequencies below 1 Hertz, in addition to higher frequencies.

A further object of the present invention is to provide an improved self-tuning bandpass filter capable of simultaneously satisfying all of the above objects.

IN THE DRAWINGS

DETAILED DESCRIPTION OF THE INVENTION

Figures 1, 2:
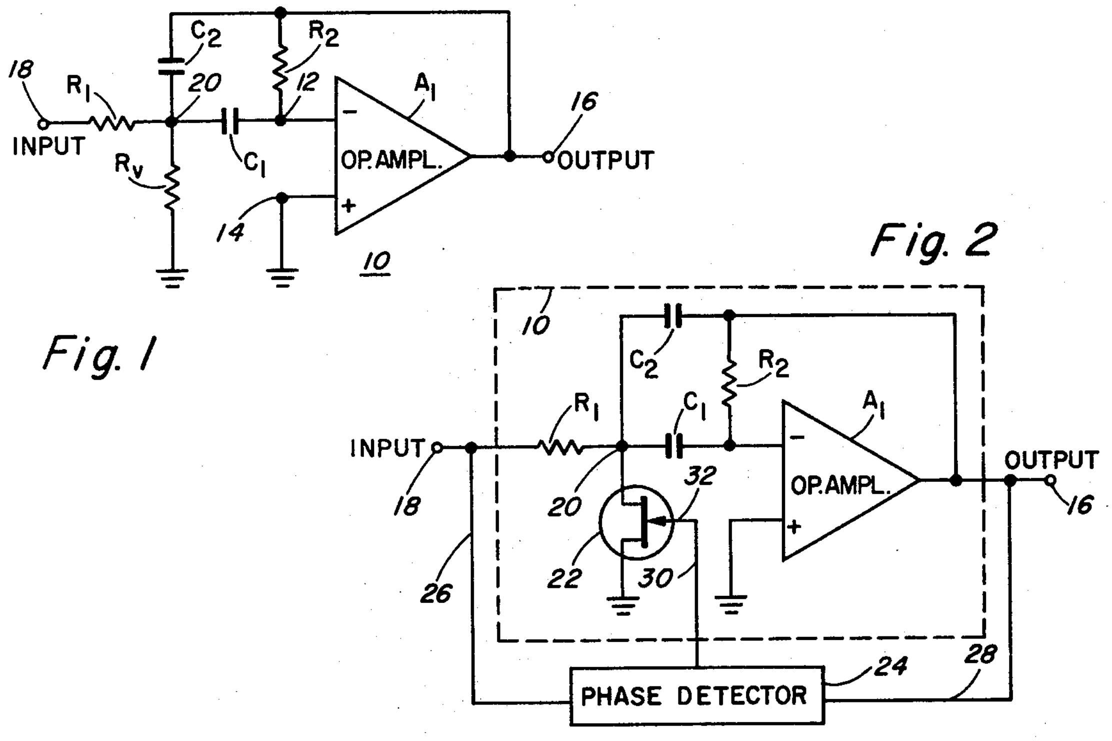
FIG. 1 is a simplified circuit diagram illustrating the basic filter network utilized in the present invention.
FIG. 2 is a simplified circuit diagram of an active self-tuning network filter in accordance with the present invention.

Referring now to FIG. 1 of the drawings, a circuit diagram is provided showing a basic RC bandpass filter circuit 10 of the type utilized in the present invention. This circuit includes an operational amplifier $A_1$ having a negative input terminal 12, a positive input terminal 14 and an output terminal 16 which also serves as the circuit output terminal. The circuit input terminal 18 is coupled to the negative input terminal 12 of amplifier $A_1$ through a series circuit including a resistor $R_1$ and capacitor $C_1$. A capacitive feedback loop including the capacitor $C_2$ is provided from the output 16 of amplifier 10 to the circuit point 20 and a resistive feedback path including the resistor $R_2$ is provided between output terminal 16 and the negative input terminal 12 of amplifier $A_1$. Circuit point 20 is also coupled to circuit ground through a resistor $R_v$ and the positive input terminal 14 of amplifier $A_1$ is directly connected to circuit ground.

The operative characteristics of this type of filter circuit may be noted by examining the transfer function which, in the case where $C_1 = C_2 = C$, may be written as $$\frac{e_{out}}{e_{in}} = \frac{\frac{p}{CR_1}}{p^2 + \frac{2}{CR_2}p + \frac{1}{C^2R_2}\left(\frac{1}{R_1} + \frac{1}{R_v}\right)} \quad (1)$$

in which $e_{in}$ is the voltage measured at the input terminal 18, $e_{out}$ is the voltage measured at the output terminal 16 and p is an operator equal to $j\omega$ for steady state analysis as in this case. From this relationship it can be shown that the center frequency $f_o$, center frequency gain $A_o$ and bandwidth $\beta$ of a filter described by the transfer function of equation (1) are as follows:

$$f_o = 1/2\pi C \sqrt{1/R_2(1/R_1 + 1/R_v)}\ \text{Hz} \quad (2)$$

$$A_o = -R_2/2R_1 \quad (3)$$

and $$\beta = 2/CR_2 \text{ radians per sec} = 1/\pi CR_2 \text{ Hz.} \quad (4)$$

Similarly, the Q for the filter described by equation (1) can be written as $$Q = f_o/\beta = 2/\sqrt{R_2(1/R_1 + 1/R_v)} \quad (5)$$

From equations (2), (3) and (4), it can be seen that $f_o$ can be varied by changing the value of resistor $R_v$ without affecting the gain $A_o$ or bandwidth $\beta$. Equations (2) and (4) show that while the center frequency $f_o$ and bandwidth $\beta$ can be changed by changing the circuit capacitance, equation (3) shows that neither the center frequency gain nor the $Q$ will be affected by changing the circuit capacitance. This is an important convenience in circuits requiring range switching.

From the above, it can be seen that if the resistance $R_v$ is made to vary appropriately, the filter will remain tuned to the input signal frequency applied at input terminal 18. As illustrated in FIG. 2 of the drawings, this can be accomplished by substituting a variable resistance such as the FET 22, for the resistor $R_v$. The FET is a particularly appropriate variable circuit element since because of its voltage variable characteristics, a completely electronic control system can easily be implemented without utilization of mechanical components. The control of FET 22 is accomplished through the use of a phase detector 24 having a first input 26 coupled to input terminal 18 and a second input 28 coupled to output terminal 16. The output 30 of phase detector 24 is coupled to the gate 32 of FET 22 so that the resistance thereof is controlled in proportion to the phase relationship between the input and output signals.

Recognizing that when the filter is tuned to the frequency of the input signal there is a 180° phase shift between the input terminal 18 and the output terminal 16, as indicated by the minus sign in equation (3), and similarly, that when the filter circuit is not tuned to the input signal applied at terminal 18 the phase shift between the input and output signals will be other than 180°, it will be apparent that this characteristic of the circuit can be utilized to provide the voltage required to vary FET 22 so as to keep the circuit continuously tuned to the input signal frequency.

Bandpass filters are commonly used in instrumentation and other electronic systems to improve signal-to-noise ratio. In those systems where the frequency of the signal is variable a wide-band filter was heretofore used so as to avoid signal attenuation. This, of course, limited the effectiveness of the filtering.

Figure 3:
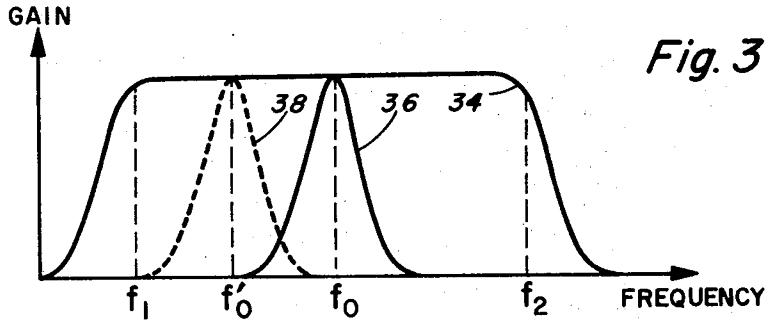
FIG. 3 is a frequency response diagram illustrating the operation of the present invention as compared with a prior art filter.

In FIG. 3 of the drawings, the bandpass characteristic of a wide-band filter (curve 34) is compared to the passband of the present invention for purposes of illustration. Where $f_o$ is the center frequency of an input signal which may vary between the frequencies $f_1$ and $f_2$, a bandpass characteristic of the type indicated at 34 is generally utilized in prior art circuits. However, in accordance with the present invention, a filter of the substantially narrower bandwidth illustrated at 36 can be utilized in order to substantially improve the signal-to-noise ratio of the circuit. This is made possible by the feature of the present invention which causes the center frequency $f_o$ of a narrow passband to follow the input signal frequency while maintaining the bandwidth constant. For example, should the frequency $f_o$ of the input signal vary to $f'_o$, the bandpass curve 36, through variation of the FET 22 by phase detector 24, will shift to the position 38 so as to be centered about $f'_o$. Because of this feature, the noise level is reduced by the filtering action but the signal level is not reduced. The present invention thus provides a solution for those applications in which it is desirable that the bandwidth as well as the center frequency gain remain constant as the filter self-tunes.

Figure 4:
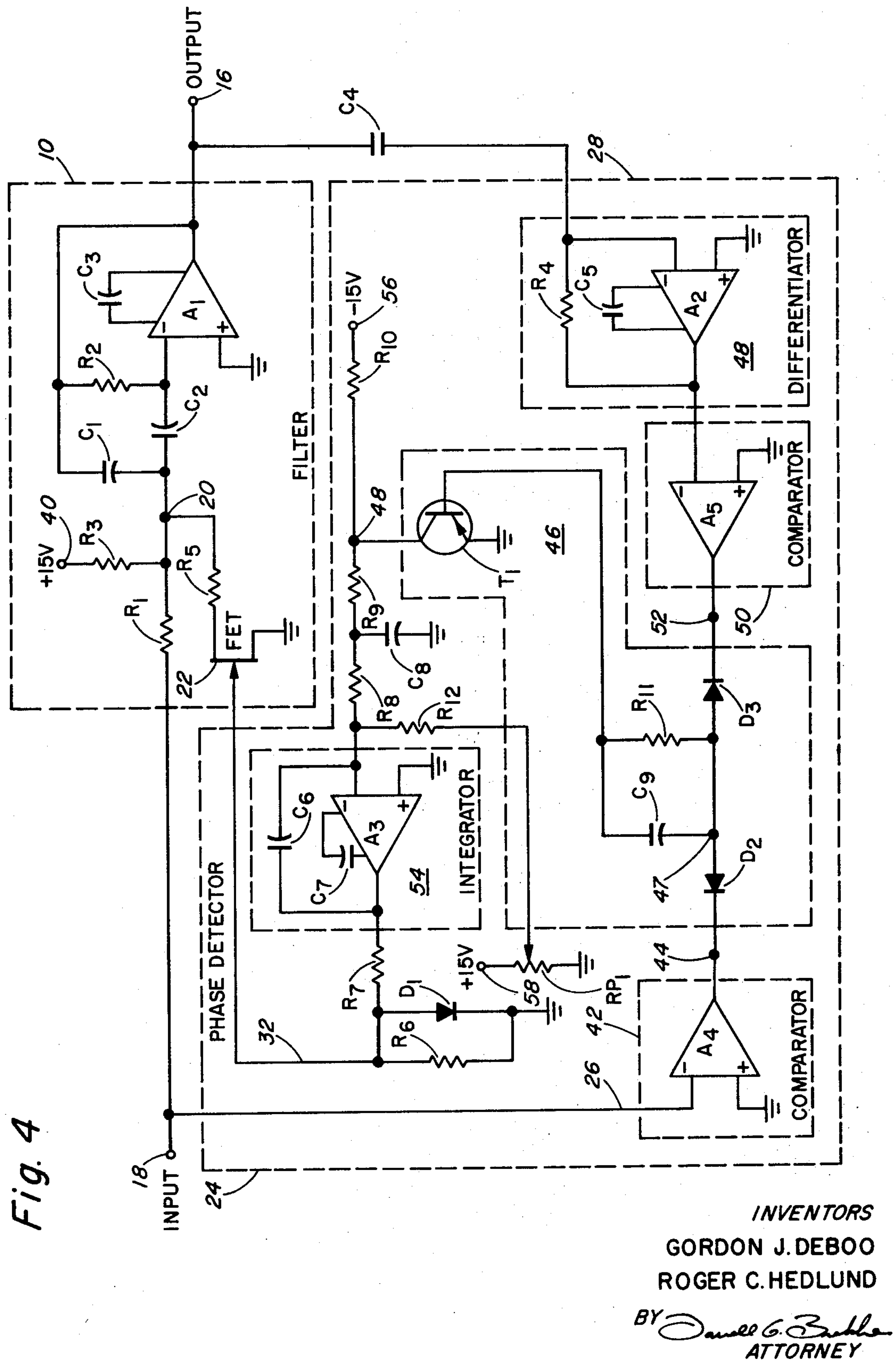
FIG. 4 is a schematic diagram of a preferred embodiment of a self-tuning bandpass filter in accordance with the present invention.

Turning now to FIG. 4 of the drawings, a more detailed schematic diagram of a practical embodiment of the present invention is illustrated. The filter 10 is substantially the same as is illustrated in FIG. 2 of the drawings, except that an additional resistor $R_3$ has been connected between the circuit point 20 and a 15 volt source of potential applied at terminal 40, and a biasing resistor $R_5$ has been inserted between the drain of FET 22 and circuit point 20 to provide proper biasing for the FET 22.

The input signal at terminal 18 is coupled through the input 26 of phase detector 24 into the negative input terminal of a comparator 42 including an operational amplifier $A_4$. The output of comparator 42 is coupled to input terminal 44 of a logic circuit 46 comprised of diodes $D_2$, $D_3$, transistor $T_1$, resistor $R_{11}$ and capacitor $C_9$. The filter output signal appearing at output terminal 16 is coupled via capacitor $C_4$ to the other input terminal 28 of phase detector 24 into the negative input of a differentiator 48 which introduces an additional 90° phase shift into the output signal. Differentiator 48 includes an operational amplifier $A_2$, resistor $R_4$ and capacitor $C_5$. The output of differentiator 48 is fed into the negative input of a comparator 50 comprised of an operational amplifier $A_5$ whose output is coupled into a second input 52 of the logic circuit 46.

The output of logic circuit 46 is fed through a filtering circuit including resistor $R_8$, resistor $R_9$ and capacitor $C_8$ into the negative input of an integrator 54 which includes the operational amplifier $A_3$ and capacitors $C_6$ and $C_7$. Biasing for transistor $T_1$ of logic circuit 46 is provided through resistor $R_{10}$ by a 15 volt potential applied at terminal 56. A +15 volt potential is applied at terminal 58 and is coupled through the potentiometer $RP_1$ and resistor $R_{12}$ to the negative input terminal of integrator 54. The output of integrator 54 is fed through a resistor $R_7$ to the gate 32 of FET 22. Protection for gate 32 of FET 22 is provided by the circuit including resistor $R_6$ and diode $D_1$.

In an actual model of the preferred embodiment illustrated in FIG. 4, the following values were used for the various components:

$R_1$ — 7.5KΩ
$R_2$ — 15KΩ
$R_3$ — 2.7KΩ
$R_4$ — 10KΩ
$R_5$ — 15Ω
$R_6$ — 1MΩ
$R_7$ — 10KΩ
$R_8$ — 10KΩ
$R_9$ — 10KΩ
$R_{10}$ — 10KΩ
$R_{11}$ — 1.5KΩ
$R_{12}$ — 33KΩ
$C_1$ — 0.01μf
$C_2$ — 0.01μf
$C_3$ — 10pf
$C_4$ — 1000pf
$C_5$ — 33pf
$C_6$ — 0.22μf
$C_7$ — 33pf
$C_8$ — 1μf
$C_9$ — 100pf
FET 22 — 2N4447
$T_1$ — 2N3645
Op Amp $A_1$ — LM201
Op Amp $A_2$ — LM201
Op Amp $A_3$ — LM201
Op Amp $A_4$ — LM201
Op Amp $A_5$ — LM201
$D_1$, $D_2$, $D_3$ — 1N459

The active elements listed above are manufactured by the National Semiconductor Corporation of Santa Clara, Calif.

Figure 5:
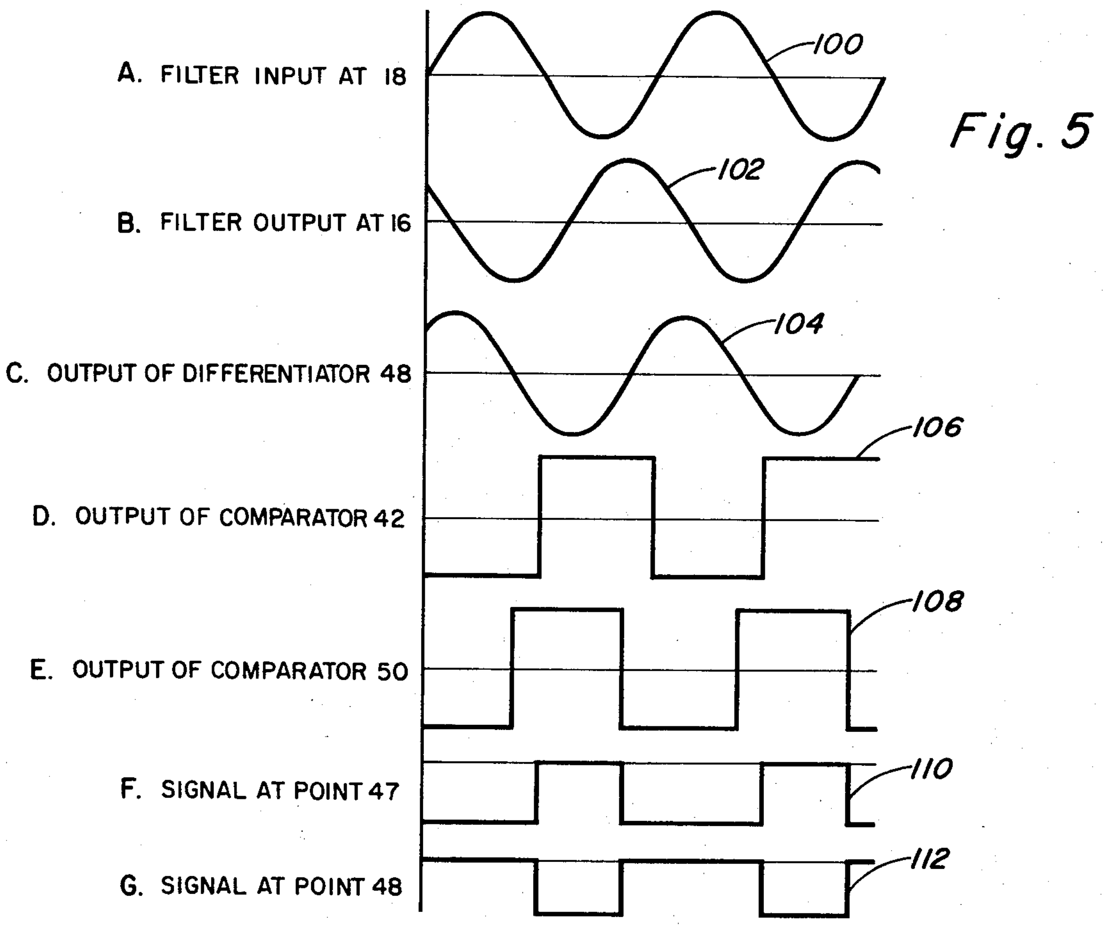
FIG. 5 is a timing diagram illustrating the operation of the self-tuning bandpass filter of the present invention.

The operation of the circuit of FIG. 4 can be illustrated by referring to the timing diagram of FIg. 5. It is first assumed that the input signal to the filter is a sine wave as shown by the curve 100 in FIG. 5A and the output signal obtained from the filter is another sine wave 102 (FIG. 5B) which is more than 180° out of phase with the input signal. At this point, the filter is obviously not tuned to the input signal frequency since, according to equation (1) above, there must be a 180° phase difference $f_0$ of the input signal.

The first step in the tuning process is the differentiation of the filter output signal by the differentiator 48. This introduces an additional 90° phase shift which is necessary to make the final FET control voltage become positive or negative as required. The differentiated waveform is shown as curve 104 in FIG. 5C. The input signal 100 and the differentiated output signal 104 are then converted into the square waves 106 (FIG. 5D) and 108 (FIG. 5E) by the comparators 42 and 50, respectively. These square waves are then fed into the logic circuit 46 to produce the waveform 110 (FIG. 5F) at circuit point 47 which is then inverted by transistor $T_1$ to provide the signal 112 (FIG. 5G) at terminal 48.

When the filter input and output signals 100 and 102 are exactly 180° out of phase, i.e., when the filter is tuned, signal 112 attains an average DC level of $E_o$. However, as the phase shift increases or decreases from 180°, this DC level will change to $E_o \pm \Delta E_o$, and by cancelling the voltage $E_o$ through the application thereto of an opposing DC voltage derived from terminal 56 through the potentiometer $RP_1$ and resistor $R_{12}$, the error voltage $\pm \Delta E_o$ can be separated and amplified by the integrator 54 for use in controlling FET 22. Integrator 54 has a high DC gain of about $10^5$ to provide a strong correcting signal to the gate 32 of FET 22, but a low AC gain to remove ripple from the error voltage.

Figure 6:
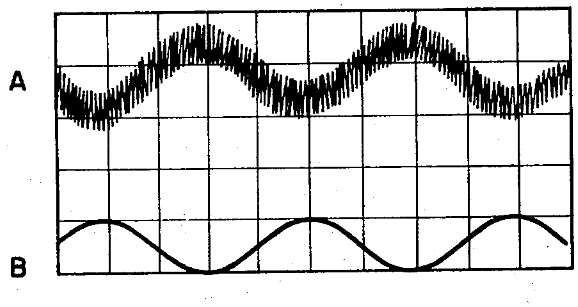
FIG. 6 illustrates the filtering action of the present invention.

FIG. 6 illustrates at B the effect of the circuit on the noisy input signal shown at A. The curve A is an unfiltered 5kHz 1 volt peak-to-peak sine wave which was applied to input terminal 18 and curve B is the resultant filtered signal obtained at output terminal 16. This example was provided using a calibrated white noise source having a 3db point at 30kHz and a roll-off of 6db per octave above 30kHz.

Figures 7, 8:
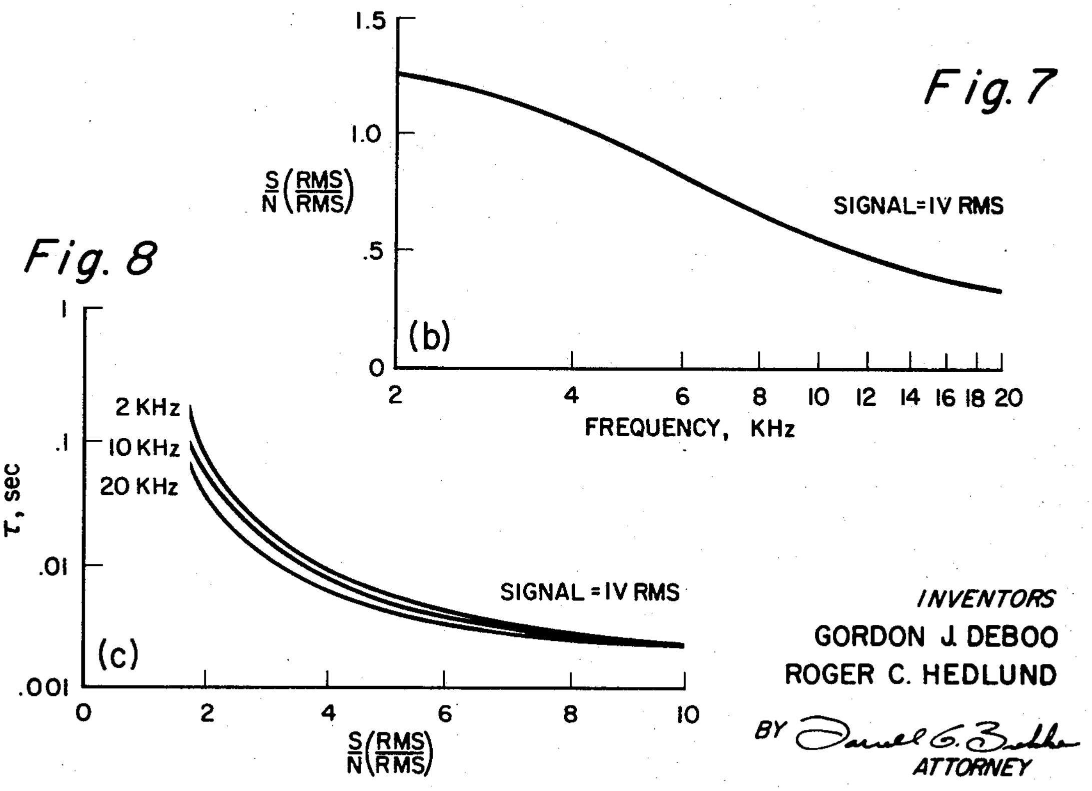
FIG. 7 is a diagram illustrating operation of the present invention.
FIG. 8 is another diagram illustrating operation of the present invention.

FIG. 7 is a plot of the minimum signal-to-noise ratio necessary for the filter to lock in to an input signal of 1 volt RMS. The filter will lock in better at higher frequencies, however, because there are more cycles of signal per unit time. This, of course, enhances the ability of the filter to lock in to a given input signal.

FIG. 8 is a diagram illustrating the time required for the filter to lock in to a signal suddenly applied in the presence of noise. As would be expected, the lock in time is less for higher frequencies and for high signal-to-noise ratios.

With the values shown above, the filter self-tunes from 2kHz to 20kHz, and over this range the gain remains constant to better than plus or minus 1 percent. The circuit of the present invention may also be used to phase shift a signal by an amount independent of frequency while maintaining a constant amplitude as frequency is changed. This can be done by setting $RP_1$ to give phase shifts other than 180° between the input and output.

Although it is contemplated that many modifications of the above disclosed invention will become apparent to those of skill in the art after having read this description of a preferred embodiment, it is to be understood that the above disclosure is made for purposes of illustration only and is in no way intended to be limiting. Accordingly, it is intended that the appended claims be interpreted as including all modifications which fall within the true spirit and scope of the invention.

What is claimed is:

1. A self-tuning, constant-bandwidth, constant-gain filter device comprising:
   - a filter circuit for receiving an input signal and operative to provide an output signal, said filter circuit having a passband of a constant bandwidth and a constant gain and including a variable impedance means responsive to a control signal for determining the center frequency of said passband;
   - a phase detector responsive to said input signal and said output signal for developing said control signal in response to the phase relationship between said input and output signals;
   - said filter means including an operational amplifier having first and second input terminals and an output terminal, an input circuit including a first resistor and a first capacitor connected in series for coupling said input signal to said first input terminal, the connection between said first resistor and said first capacitor forming a junction, a capacitive feedback circuit coupling said output terminal and said junction, a resistive feedback circuit coupling said output terminal and said first input terminal, and said variable impedance means being coupled between said junction and said second input terminal.

2. A self-tuning, constant-bandwidth, constant-gain filter device as recited in claim 1 wherein said phase detector includes a differentiator for differentiating the signal appearing at said output terminal, comparator means responsive to the output of said differentiator and the signal appearing at said first input terminal for generating a square-wave signal, logic circuit means coupled to said comparator means for rectifying said square-wave signal and producing a d-c output voltage, means coupled to said logic circuit means for offsetting the average of said d-c voltage, an integrator having an input and an output, said logic circuit means being coupled to said integrator input, and said control signal being produced at said integrator output.

3. A self-tuning, constant-bandwidth, constant-gain filter device as recited in claim 1 wherein said variable impedance means is a variable resistance means coupled between said junction and second input terminal.

4. A self-tuning, constant-bandwidth, constant-gain filter device as recited in claim 3 wherein said variable resistance means is a field-effect transistor having a gate electrode, a source electrode, and a drain electrode, said drain electrode being coupled to said junction, said source electrode being coupled to said second input terminal, and said gate being coupled to the output of said phase detector.

5. A self-tuning, constant-bandwidth, constant-gain filter device as recited in claim 4 wherein said phase detector includes a differentiator for differentiating the signal appearing at said output terminal, comparator means responsive to the output of said differentiator and the signal appearing at said first input terminal for generating a square-wave signal, logic circuit means coupled to said comparator means for rectifying said square-wave signal, and producing a d-c output voltage, means coupled to said logic circuit means for offsetting the average of said d-c voltage, an integrator having an input and an output, said logic circuit means being coupled to said integrator input, and said control signal being produced at said integrator output.

* * * * *